United States Patent
Peng et al.

(10) Patent No.: US 10,663,397 B2
(45) Date of Patent: May 26, 2020

(54) METHOD AND DEVICE OF ENHANCING TERAHERTZ WAVE SIGNALS BASED ON HOLLOW METAL WAVEGUIDE OPTICAL FIBER

(71) Applicant: University of Shanghai for Science and Technology, Shanghai (CN)

(72) Inventors: Yan Peng, Shanghai (CN); Bowei Xu, Shanghai (CN); Yiming Zhu, Shanghai (CN); Tengfei Zhang, Shanghai (CN); Wanqing Chen, Shanghai (CN); Binbin Qi, Shanghai (CN); Songlin Zhuang, Shanghai (CN)

(73) Assignee: University of Shanghai for Science and Technology, Shanghai (CN)

( * ) Notice: Subject to any disclaimer, the term of this patent is extended or adjusted under 35 U.S.C. 154(b) by 0 days.

(21) Appl. No.: 16/258,345

(22) Filed: Jan. 25, 2019

(65) Prior Publication Data
US 2019/0154575 A1 May 23, 2019

Related U.S. Application Data

(63) Continuation of application No. PCT/CN2016/000613, filed on Nov. 7, 2016.

(51) Int. Cl.
*G01N 21/3581* (2014.01)
*G01J 5/08* (2006.01)
(Continued)

(52) U.S. Cl.
CPC ............ *G01N 21/3581* (2013.01); *G01J 5/08* (2013.01); *G01J 5/0818* (2013.01);
(Continued)

(58) Field of Classification Search
CPC ...... G01J 5/08; G01J 5/0818; G01N 21/3581; G02F 1/3501; G02F 1/365; G02F 1/37; H02S 3/0092
See application file for complete search history.

(56) References Cited

U.S. PATENT DOCUMENTS 7,595,491 B2    9/2009  Zhang et al.
2001/0038074 A1  11/2001  Zhang
(Continued)

FOREIGN PATENT DOCUMENTS

CN    101335425 A    12/2008
CN    102868080 A    1/2013
(Continued)

OTHER PUBLICATIONS

Bowden, Bradley, James A. Harrington, and Oleg Mitrofanov. "Low-loss modes in hollow metallic terahertz waveguides with dielectric coatings." Applied physics letters 93.18 (2008): 181104. (Year: 2008).*

(Continued)

*Primary Examiner* — Wyatt A Stoffa
(74) *Attorney, Agent, or Firm* — Wayne & Ken, LLC; Tony Hom

(57) ABSTRACT

A device and method of enhancing terahertz wave signals based on a hollow metal waveguide are disclosed. Simple devices such as a beam splitter, multiple plane mirrors, a beam combiner and an adjustable delay system are used. Two laser beams having a wavelength of 800 nm split by the beam splitter generate a fixed time phase delay, and are converged in the hollow metal waveguide to sequentially overlap with pulse of a laser having a wavelength of 400 nm for nonlinear interaction to ionize gas in the optical fiber to generate terahertz waves. The hollow metal waveguide can
(Continued)

converge and transmit the generated terahertz waves due to its total reflection characteristics.

1 Claim, 3 Drawing Sheets

(51) Int. Cl.
 G02F 1/35 (2006.01)
 G02F 1/365 (2006.01)
 H01S 1/02 (2006.01)
 H01S 1/06 (2006.01)
(52) U.S. Cl.
 CPC ............ G02F 1/3501 (2013.01); G02F 1/365 (2013.01); H01S 1/02 (2013.01); H01S 1/06 (2013.01)

(56) References Cited

U.S. PATENT DOCUMENTS

2008/0023633 A1* 1/2008 Mittleman ................ G01J 3/42
 250/341.1
2009/0074016 A1* 3/2009 Marner ................... G01J 3/108
 372/22
2016/0169735 A1* 6/2016 Uchida ................. G01J 1/0223
 250/341.1

FOREIGN PATENT DOCUMENTS

| CN | 103411903 A | 11/2013 |
| CN | 103840366 A | 6/2014 |
| CN | 104677497 A | 6/2015 |
| CN | 105928624 A | 9/2016 |
| WO | 2008091419 A2 | 7/2008 |

OTHER PUBLICATIONS

Zhong Renbin et al., Research Development of Terahertz Waveguides, Journal of University of Electronic Science and Technology of China, 2012, 41(2), 247-252.

Das.J et al., Terahertz wave excitation from preexisting air plasma, J. Opt. Soc. Am. B, vol. 30, No. 6, May 21, 2013, p. 1595, right column, paragraph 2 to 1596, left column, paragraph 2, Figures 1-2.

\* cited by examiner

METHOD AND DEVICE OF ENHANCING TERAHERTZ WAVE SIGNALS BASED ON HOLLOW METAL WAVEGUIDE OPTICAL FIBER

CROSS-REFERENCE TO RELATED APPLICATIONS

This application is a continuation of International Patent Application No. PCT/CN2016/000613, filed on Nov. 7, 2016, which claims the benefit of priority from Chinese Application No. 201610238498.4, filed on Apr. 18, 2016. The contents of the aforementioned applications, including any intervening amendments thereto, are incorporated herein by reference.

TECHNICAL FIELD

The present disclosure relates to devices for enhancing terahertz waves, and more particularly to a device and method of enhancing terahertz wave signals based on a hollow metal waveguide.

BACKGROUND

In recent decades, terahertz wave has become an important research topic in the physical field because of its wide application prospect. Terahertz radiation is an electromagnetic wave with a frequency ranging from 0.1 to 10 THz. Such wave band, with abundant information, high spatial-temporal coherence, low photon energy, etc., is located between the microwave and the infrared wave, and is of great application values in astronomy, biology, computer science, communications and other applications. At present, the main application researches include terahertz time-domain spectroscopy, terahertz imaging, security inspection, terahertz radar, astronomy and communications.

At present, the generation of terahertz waves by laser filament in air is a relatively common, simple and reliable method. The principle of the method is that a laser with a wavelength of 800 nm is partially converted into a laser with a wavelength of 400 nm when being converged to pass through a BBO frequency doubling crystal. According to the relevant nonlinear properties of lasers, when the pulses of the two laser beams are overlapped, a strong terahertz wave can be radiated from the ionized gas medium.

Since two laser beams with different wavelengths have different refractive indexes and propagation speeds when propagate in a medium, and the pulse widths of the two laser beams are extremely small, the time for the two laser beams overlapping to generate strong terahertz waves is very short. When the pulses of the two laser beams are gradually separated from each other along with their propagation, the generated energy of terahertz wave signals will decrease quickly. The main advantages of the laser-filament method are that the obtained terahertz waves have a broad bandwidth, the device is convenient to build with a small occupying space, and the overall cost is relatively low. However, there is also a problem that the coherence length is short (usually on the order of millimeter), leading to ineffectively utilization of the laser energy during a long propagation distance.

In addition, the air contains water vapor, which has a stronger absorption for the terahertz waves. Therefore, the temperature, humidity and other environmental conditions have a significant impact on the generation, detection, and collection of the terahertz waves.

All of these problems greatly reduce the efficiency and cost performance of generating the terahertz waves.

SUMMARY

The present disclosure, directed to two problems that terahertz waves are greatly absorbed by the water vapor in the air, and the low conversion efficiency of the terahertz waves in air filament due to the short overlap time of two laser beams with different wavelengths, provides a device and method of enhancing terahertz wave signals based on a hollow metal waveguide, reducing terahertz wave energy loss and increasing intensity of terahertz wave.

According to one aspect, a method for enhancing terahertz wave signals based on a hollow metal waveguide is provided, the method including: splitting, by a beam splitter, an incident laser beam into a transmitted laser beam and a reflected laser beam, wherein each of the incident laser beam, the transmitted laser beam and the reflected laser beam has a wavelength of 800 nm; passing the transmitted laser beam sequentially through a group of plane mirrors, a first convex lens and a β-Barium Borate (BBO) crystal to get a first laser beam with a wavelength of 400 nm and a second laser beam with a wavelength of 800 nm; passing the reflected laser beam through a first plane mirror, an adjustable delay system, a second plane mirror and a second convex lens to get a third laser beam, wherein the third laser beam has a time-phase delay with respect to the first and the second laser beams; passing the first and the second laser beams together with the third laser beam through a beam-combination mirror to be converged into the hollow metal waveguide filled with dry gas; wherein all the first, the second and the third laser beams are focused at an entrance of the hollow metal waveguide; terahertz waves output from the hollow metal waveguide are collected by a parabolic mirror, and then entered into a detection system; wherein: after entering the hollow metal waveguide, the first and the second laser beams are overlapped to ionize gas medium and to radiate the terahertz waves in forward propagation; as the propagation distance increases, the first laser beam and the second laser beam are gradually separated from each other; and by adjusting the delay system, the third laser beam overlap with the first laser beam in a case that the first laser beam is completely separated from the second laser beam, so as to continuously generate the terahertz waves.

The device for enhancing terahertz wave signals based on the hollow metal waveguide includes a laser source to emit an incident laser with a wavelength of 800 nm, and a beam splitter to split the incident laser into a first laser beam as transmitted laser and a second laser beam as reflected laser. The transmitted laser with a wavelength of 800 nm is sequentially reflected by a group of plane mirrors, then converged by a first convex lens to enter into a BBO crystal and partially converted into a laser with a wavelength of 400 nm. Lasers output from the BBO crystal have wavelengths of 800 nm and 400 nm. The reflected laser with a wavelength of 800 nm passes through a first plane mirror, an adjustable delay system, a second plane mirror and a second convex lens, and generates a fixed time phase delay with the lasers having wavelengths of 800 nm and 400 nm output from the BBO crystal. Then, all the reflected laser with a wavelength of 800 nm and the lasers having wavelengths of 800 nm and 400 nm pass through a beam-combination mirror to be converged into the hollow metal waveguide filled with dry gas. Focuses of the transmitted laser and the reflected laser converged by the first and second convex lenses are located at the entrance of the hollow metal waveguide. Terahertz waves output from the hollow metal waveguide are collected by a parabolic mirror, and then entered into a detection system.

The method of enhancing terahertz wave signals based on the hollow metal waveguide includes:

turning on the laser source; wherein 800 nm and 400 nm laser pulses output from the BBO crystal are overlapped with each other in the hollow metal waveguide, as the first laser beam, ionizing gas medium to radiate the terahertz waves; as the propagation distance increases, the corresponding 800 nm laser and the 400 nm laser are gradually separated from each other;

adjusting the delay system to delay the reflected laser with a wavelength of 800 nm as the second laser beam; wherein when the 800 nm laser pulses in the first laser beam are completely separated from the 400 nm laser pulses, the reflected laser with a wavelength of 800 nm as the second laser beam begin to overlap with the 400 nm laser pulses, which can continuously generate the terahertz waves; and collecting the terahertz waves output from the hollow metal waveguide by the parabolic mirror; wherein the collected terahertz waves are entered into the detection system.

The present disclosure has the following beneficial effects: The device is simple to build, and can directly and effectively increase the terahertz wave signal intensity by three times. The present disclosure has wide applications, strong practicability, simple operation, low cost, reduced terahertz wave energy loss and improved terahertz wave signal intensity.

DETAILED DESCRIPTION OF EMBODIMENTS

Figure 1:
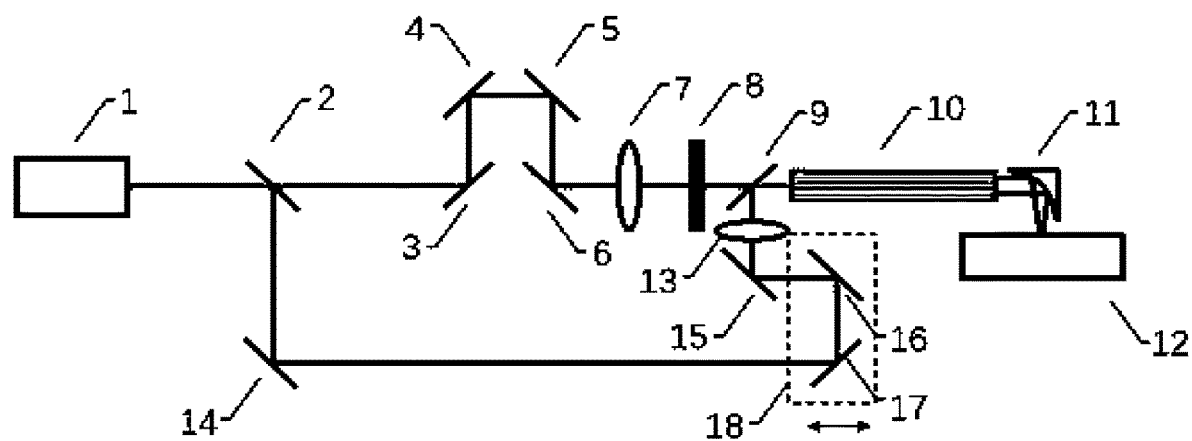
FIG. 1 is a schematic diagram of a device for enhancing terahertz wave signals based on a hollow metal waveguide according to the present invention.

FIG. 1 illustrates a device for enhancing terahertz wave signals based on a hollow metal waveguide. The device includes a laser source 1, a beam splitter 2, a plane mirror 3, a plane mirror 4, a plane mirror 5, a plane mirror 6, a convex lens 7, a BBO crystal 8, a beam-combination mirror 9, a hollow metal waveguide 10, a parabolic mirror 11, a terahertz wave detecting and applying portion 12, a convex lens 13, a plane mirror 14, a plane mirror 15, a plane mirror 16, a plane mirror 17 and a mechanical delay system movable motor 18.

An incident laser with a wavelength of 800 nm emitted by the laser source 1 passes through the beam splitter 2 to be split into a transmitted laser beam and a reflected laser beam. Transmitted laser with a wavelength of 800 nm is sequentially reflected by a group of plane mirrors consisting of the plane mirrors 3, 4, 5 and 6, and then converged by the convex lens 7 and entered into the BBO crystal 8 and partially converted into a laser beam with a wavelength of 400 nm (It should be noted that the convex lens 7 converging the transmitted 800 nm laser does not mean the focus of the transmitted laser is on the BBO crystal because the BBO crystal is susceptible to damage by the high-energy laser). Lasers output from the BBO crystal 8 have wavelengths of 800 nm and 400 nm. Reflected 800 nm laser passes through the plane mirrors 14, 15, 16 and 17 (where the plane mirrors 16 and 17 are fixed on the movable motor 18 to form the mechanical delay system) and the convex lens 13, and has a time phase delay with respect to the lasers output from the BBO crystal 8. Then, the reflected laser beam and the lasers output from the BBO crystal 8 pass through the beam-combination mirror 9 to be converged into the hollow metal waveguide 10 filled with dry gas. The laser beams converged by the convex lenses are focused at the inlet end of the hollow metal waveguide 10. In the hollow metal waveguide 10, in an initial state, the transmitted 800 nm and 400 nm laser beams are overlapped to ionize a gas medium to radiate terahertz waves. As the propagation distance increases, the 800 nm and 400 nm laser pulses are gradually separated from each other. When they completely separate, the 800 nm laser pulses no longer interacts with the 400 nm laser pulse to generate the terahertz waves. The distance between the plane mirrors 16-17 and the plane mirrors 14-15 in the adjustable delay system is adjusted by the mechanical delay system movable motor 18, thereby controlling the second 800 nm laser pulse begin to overlap with the 400 nm laser pulse, exactly as the first 800 nm laser pulse just separate with the 400 nm laser pulses, then continuously generate the terahertz waves. The intensity of the output terahertz waves can be increased by three times. The output terahertz waves are collected by the parabolic mirror 11, and then enter into the detection system 12.

In the following embodiment, after being split by a 1:1 beam splitter, the incident laser with a wavelength of 800 nm converged in the hollow metal waveguide filled with dry gas to generate the terahertz waves by air filament through the BBO frequency doubling crystal is taken as an example. The implementation methods having incident laser with other wavelength bands, beam splitter of different proportions or the filling of other kind of dry gases in the waveguide are basically the same as the embodiment.

The specific process of enhancing terahertz wave signals is as follows: The incident laser with a wavelength of 800 nm emitted by the laser source 1 passes through a 1:1 beam splitter 2 to be split into a first laser beam and a second laser beam. The transmitted laser with a wavelength of 800 nm as the first laser beam is sequentially reflected by a group of plane mirrors, and converged by the convex lens 7 and entered into the BBO crystal 8, and then partially converted into a laser with a wavelength of 400 nm (It should be noted that the convex lens 7 converging the transmitted 800 nm laser does not mean that the focus of the transmitted laser is on the BBO crystal because the BBO crystal is susceptible to damage from the high-energy laser). Reflected 800 nm laser as a second laser beam passes through the plane mirrors 14, 17, 16 and 15 (where the plane mirrors 16 and 17 are fixed on the movable motor 18 to form the mechanical delay system) and the convex lens 13, and generates a fixed time phase delay with the lasers having wavelengths of 800 nm and 400 nm output from the BBO crystal 8. Then, the second laser beam and the lasers having wavelengths of both 800 nm and 400 nm pass through the beam-combination mirror 9 to be converged into the hollow metal waveguide 10 filled with dry gas. Focuses of the first and second laser beams converged by the convex lenses are located at the inlet end of the hollow metal waveguide 10.

Figure 2:
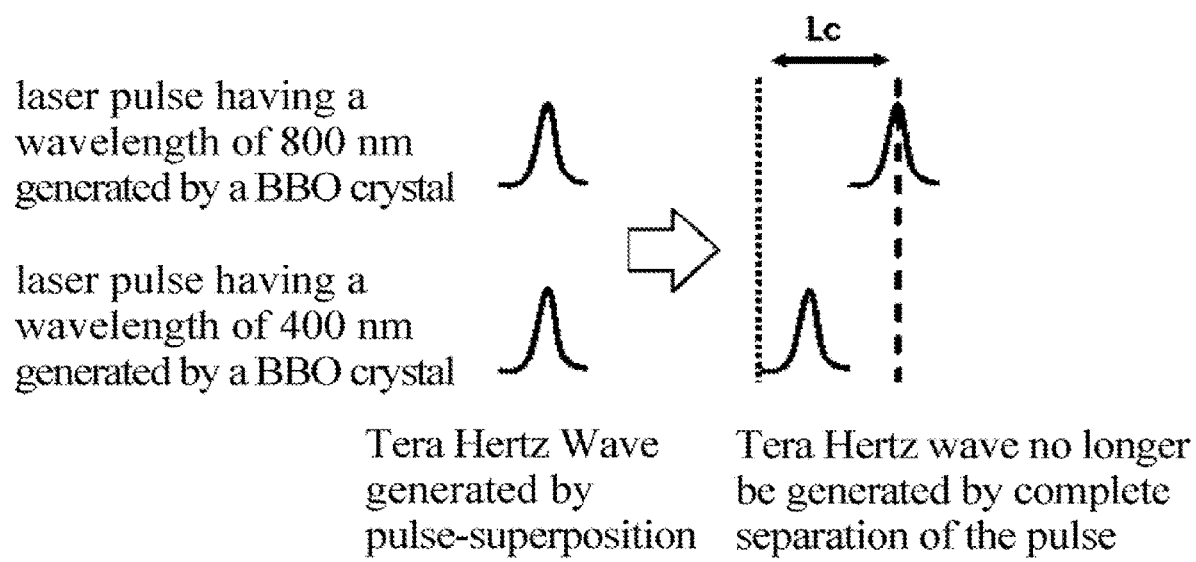
FIG. 2 is a schematic diagram showing a principle of generating terahertz waves by air filament using a BBO frequency doubling crystal according to the present invention.

In the hollow metal waveguide 10, in an initial state, the transmitted 800 nm and 400 nm laser beams are overlapped to ionize a gas medium to radiate terahertz waves in a forward propagation as shown in FIG. 2. As the propagation distance increases, the 800 nm and 400 nm laser pulses are gradually separated from each other in the time axis. When they are completely separated in the time axis, the 800 nm laser pulses no longer interact with the 400 nm laser pulse to generate the terahertz waves. The distance between the plane mirrors 16-17 and the plane mirrors 14-15 in the adjustable delay system is adjusted by the mechanical delay system movable motor 18, thereby controlling the second 800 nm laser pulse begin to overlap with the 400 nm laser pulse exactly when the first 800 nm laser pulse just separates with the 400 nm laser pulses, which can keep the terahertz waves be continuously generated. The intensity of the output terahertz waves can thus be increased by three times. The output terahertz waves are collected by the parabolic mirror 11, and then enter into the detection system 12.

Figure 3:
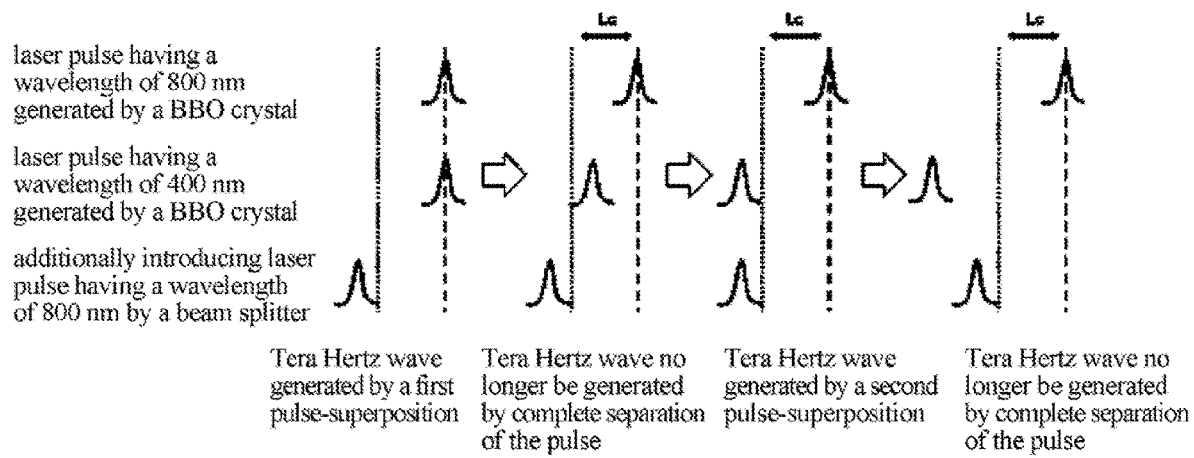
FIG. 3 is a schematic diagram showing a principle of using a beam splitter to introduce a second 800 nm laser beam to enhance terahertz wave signal intensity according to the present invention.

FIG. 3 is a schematic diagram showing the principle of enhancing of terahertz wave signal by adding the reflected laser with a wavelength of 800 nm as the second laser beam, 800 nm laser pulses and 400 nm laser pulse are overlapped with each other in a distance of three coherence lengths Lc and constantly interact with each other to generate strong terahertz waves. FIG. 2 is a schematic diagram of generating the terahertz waves by air filament using the BBO frequency doubling crystal. In the process of generating the terahertz waves by the conventional air filament method, the lasers with wavelengths of 800 nm and 400 nm are overlapped in only one coherence length Lc. Therefore, the method of the present disclosure increases the intensity of the terahertz wave signal by three times through a simple comparison.

By utilizing simple devices such as a beam splitter, multiple plane mirrors, a beam-combination mirror and a mechanical delay system, 800 nm laser as a second laser beam split by the beam splitter generates a fixed time phase delay with the lasers having wavelengths of both 800 nm and 400 nm output from the BBO crystal 8. Then, the second laser beam and the lasers having wavelengths of 800 nm and 400 nm passing through the beam-combination mirror 9 are converged into the hollow metal waveguide. The 800 nm laser beam and 400 nm laser beam are overlapped to ionize a gas medium to radiate terahertz waves. The other device uses the total reflection characteristics of the hollow metal waveguide to converge and propagate the generated terahertz waves. The two devices can be used independently for different practical situations, or they can be used together to greatly enhance the intensity of the terahertz wave signal.

What is claimed is:

1. A method for enhancing terahertz wave signals based on a hollow metal waveguide, comprising:
    splitting, by a beam splitter, an incident laser beam into a transmitted laser beam and a reflected laser beam, wherein each of the incident laser beam, the transmitted laser beam and the reflected laser beam has a wavelength of 800 nm;
    passing the transmitted laser beam sequentially through a group of plane mirrors, a first convex lens and a β-Barium Borate crystal (BBO crystal) to get a first laser beam with a wavelength of 400 nm and a second laser beam with a wavelength of 800 nm;
    passing the reflected laser beam through a first plane mirror, an adjustable delay system, a second plane mirror and a second convex lens to get a third laser beam, wherein the third laser beam has a time-phase delay with respect to the first and the second laser beams;
    passing the first and the second laser beams together with the third laser beam through a beam-combination mirror to be converged into the hollow metal waveguide filled with dry gas; wherein all the first, the second and the third laser beams are focused at an entrance of the hollow metal waveguide; terahertz waves output from the hollow metal waveguide are collected by a parabolic mirror, and then entered into a detection system; wherein:
    after entering the hollow metal waveguide, the first and the second laser beams are overlapped to ionize gas medium and to radiate the terahertz waves in forward propagation; as the propagation distance increases, the first laser beam and the second laser beam are gradually separated from each other; and
    by adjusting the delay system, the third laser beam overlap with the first laser beam in a case that the first laser beam is completely separated from the second laser beam, so as to continuously generate the terahertz waves.

* * * * *